Jan. 16, 1962 J. A. PIETSCH 3,016,715
THERMOELECTRIC ASSEMBLY
Filed Dec. 15, 1960
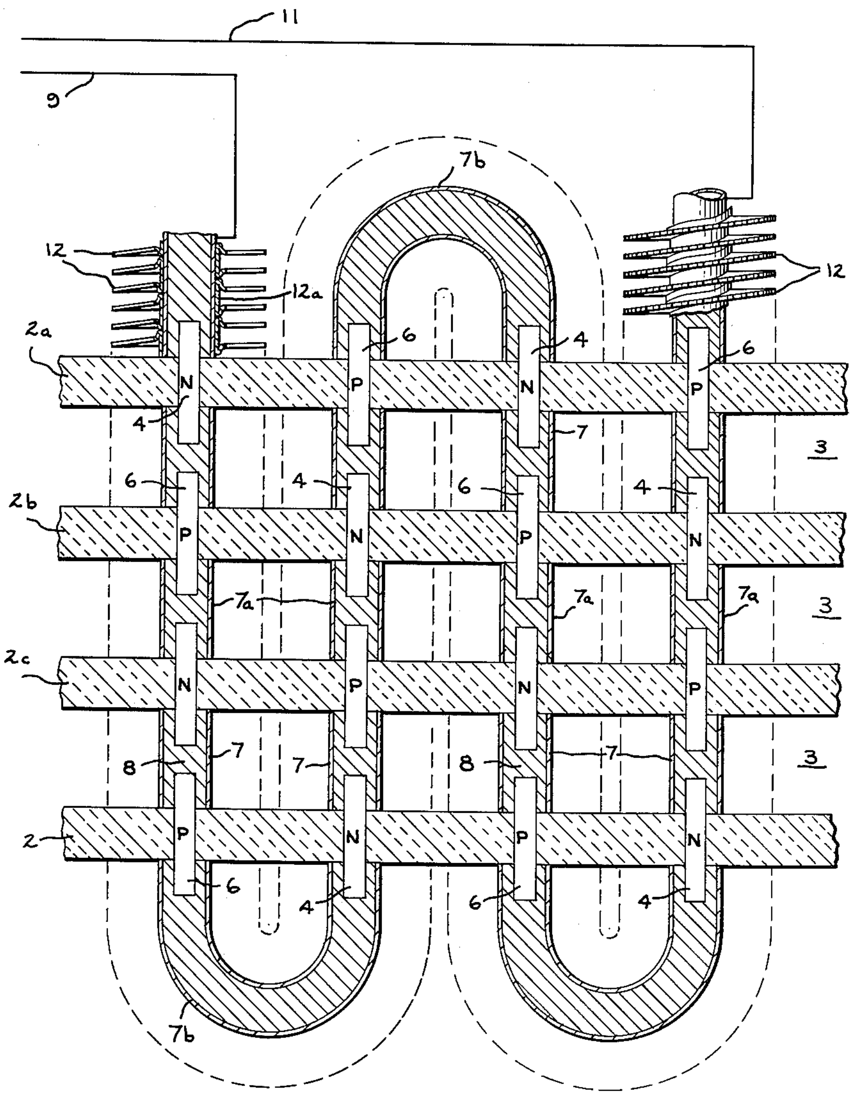
INVENTOR.
JOSEPH A. PIETSCH
BY
HIS ATTORNEY United States Patent Office 3,016,715

Patented Jan. 16, 1962

3,016,715

THERMOELECTRIC ASSEMBLY

Joseph A. Pietsch, Louisville, Ky., assignor to General Electric Company, a corporation of New York Filed Dec. 15, 1960, Ser. No. 76,028
6 Claims. (Cl. 62—3)

The present invention relates to a thermoelectric heating or cooling device incorporating an improved structural arrangement for the thermoelectric members and their associated electrical conducting links.

When two materials of dissimilar thermoelectric properties are joined and a direct current is passed therethrough, the junction becomes either hot or cold depending upon the direction of the electrical current flowing through the junction. This phenomenon is known as the Peltier effect and exists in all junctions of dissimilar materials to some extent. Some materials or alloys, due to a combination of thermal and electrical properties, produce heating or cooling effects that are many times the magnitude of others and these materials are called thermoelectric materials. For example, thermal junctions formed between certain alloys of lead, bismuth or antimony combined in varying quantities with tellurium or selenium and having controlled amounts of impurities, such as gold, silver, or sulphur, have exhibited heating and cooling properties of a magnitude that can be usefully employed as heating or cooling devices to the fields of air conditioning and refrigeration.

A thermoelectric heating and cooling device, in its simplest form, comprises an array of thermoelectric elements of dissimilar thermoelectric materials connected in series by a plurality of connector links of heat and electrically conductive material. A direct current is passed through the series connected array and the thermal junctions become either hot or cold depending upon the direction of current flowing therethrough. All hot junctions are segregated from the cold junctions by means of heat insulating material inserted between the respective junctions. The cold junctions and their associated conductor links then produce a cooling effect in one ambient, while the hot junctions and their associated conductor links dissipate heat to another ambient. Thus, the conductor links connecting the dissimilar thermoelectric members not only serve to conduct electrical current between the thermoelectric materials but also act as heat exchange surfaces through which heat is transferred to and from the ambients adjacent thereto. In order to provide an efficient thermoelectric heating or cooling device, the design and structural arrangement of the thermal junctions between the conductor links and the thermoelectric elements must provide not only rapid heat flow between the respective conductor link and its associated thermoelectric element, but rapid heat flow must also be provided between the conductor links and the medium adjacent thereto.

Accordingly, it is an object of the present invention to provide an improved structural arrangement for a thermal junction between a thermoelectric element and its associated conductor link.

It is another object of the present invention to provide an improved thermal junction arrangement between a thermoelectric element and its associated conductor link which provides efficient heat exchange between the conductor link and the ambient adjacent thereto.

It is a further object of the present invention to provide an improved thermoelectric heat exchange device incorporating a plurality of thermal junctions having an improved structural arrangement designed to promote efficient heat exchange with fluids passing through the heat exchange device.

Further objects and advantages of the invention will become apparent as the following description proceeds and the features of novelty which characterize the invention will be pointed out with particularity in the claims annexed to and forming a part of this specification.

In carrying out the objects of the present invention there is provided a junction formed of a thermoelectric element and a tubular conductor link of electrical and heat conducting material. A portion of the thermoelectric element extends into one end of the tubular link and is thermally and electrically connected therein. The conductor links are provided with fin means which extend outwardly from the periphery of the tubular link into heat exchange relationship with a fluid media to be heated or cooled. Heat exchange takes place around the entire periphery of the junction between the thermoelectric element and the tubular conductor link and this heat is, in turn, dissipated or absorbed, whichever the case may be, by the fins of the conductor link around the entire body of the link.

For a better understanding of the invention, reference may be had to the accompanying drawing, the single figure of which, is a cross-sectional view of a thermoelectric heat exchange device incorporating thermal junctions of the present invention.

Referring now to the drawing, there is shown a thermoelectric heat exchange device formed by a plurality of panels of electrical and heat insulating material, generally designated by the reference numeral 2, which are arranged in parallel spaced-apart relationship to provide spaces 3 between each pair of panels for the flow of a fluid medium therethrough. The illustrated heat exchange device is utilized as an air conditioner in which indoor air and outdoor air streams are passed through the spaces 3 between adjacent pairs of panels. Thus indoor air may be circulated by a fan (not shown) between the panels **2*a* and 2*b* while outdoor air is circulated between panels 2*b* and 2*c*. Mounted through the panels are a plurality of dissimilar thermoelectric elements 4 and 6 each having a portion thereof extending outwardly from the panels into the spaces 3. The thermoelectric elements in the respective panels are arranged so that the elements of one panel are substantially in alignment with the elements of the opposite panel. Thus, all of the elements 4 in panel 2*a* are aligned with the elements 6 in the panel 2*b*** and vice versa.

The thermoelectric elements 4 and 6 are designated either N or P. The N and P nomenclature is prevalent in semi-conductor terminology at present and is used herein for convenience in differentiating materials having dissimilar thermoelectric properties. An N material includes an abundance of electrons while a P material includes an abundance of electron vacancies or holes. A thermocouple is formed by connecting an element 4 of N type material with an element 6 of P type material. As may be seen in the drawing, the N and P type elements are connected in series by a plurality of conductor links 7 and **7*a* which are formed of a good electrical and heat conducting material, such as copper, into tubular-shape. The links fit over those portions of the thermoelectric elements extending outwardly from the insulation panels and means, such as a solder or brazing material 8, rigidly connect the thermoelectric elements 4 and 6 to the tubular-shaped conductor links 7 and 7*a* to form thermal junctions. The solder or brazing material 8** must have good electrical and thermal conductivity and any of the well-known materials of this type, such as silver solder, may be used.

When a thermocouple including an N type element and a P type element is assembled, as in the drawing, and a direct current is passed through the assembly in the positive direction, i.e. from N to P, the junction between the N and P thermoelectric elements becomes cold.

Thus, a conductor link becomes cold when a direct current is passed through the assembly in the direction of the N to P elements. Conversely when a direct current is passed through the assembly in the opposite direction, i.e. from P to N, the junction then becomes hot. Therefore, a conductor link becomes hot when a direct current flows through the assembly in the direction of the P to N elements.

As may be seen in the drawing, all of the thermoelectric elements of the heat exchange device are connected in series by the conductor links each of which extend between two dissimilar thermoelectric elements. At the upper and lower ends of the device the conductor links 7b are formed into U-shaped bends and conduct the electrical current between two thermoelectric elements 4 and 6 mounted in the same panel of insulation material. Power lines 9 and 11 connect opposite ends of the series connected array of thermoelectric elements to a suitable source of D.C. power. It will be noted that, as current flows through the device, all of the thermal junctions between any one pair of panels is either hot or cold depending upon the polarity of the applied current. Thus, if current is flowing from power line 9 to power line 11 all of the junctions in the space between panels 2a and 2b are cold, while all of the junctions in the space between the panels 2b and 2c are hot. Thus heat will be absorbed from the fluid media, or in this case indoor air, flowing between panels 2a and 2b and heat will be dissipated into the outdoor air streams flowing between the panels 2b and 2c.

The tubular conductor links 7, 7a and 7b are provided with fin means which extend outwardly from the periphery of the tube into the space 3 and are, therefore, in heat exchange relationship with the fluid media, or air streams passed between the spaced apart panels. In the illustrated embodiment of the invention, the fin means is a helically wrapped fin 12 of heat conducting material which is securely connected to the tubular link. The base section 12a of the fin conducts heat between the tubular link and the outwardly extending fins 12 which, in turn, dissipate or absorb heat from the surrounding ambient. It can be seen that, by the present arrangement, heat may be dissipated or absorbed from the respective links through the fins 12 around the entire periphery of the link. Furthermore, by extending the thermoelectric elements into the tubular links, heat may be rapidly conducted to or away from the junctions around the entire peripheral surface of the respective elements. This arrangement promotes rapid heat flow from or toward the thermal junction between the thermoelectric element and its associated conductor link as well as providing a very convenient and efficient arrangement for absorbing or dissipating this heat into the medium between the spaced apart panels.

While in accordance with the patent statutes there has been described what at present is considered to be the preferred embodiments of the invention, it will be understood by those skilled in the art that various changes and modifications may be made therein without departing from the invention, and it is, therefore, the aim of the appended claims to cover all such changes and modifications as fall within the true spirit and scope of the invention.

What I claim as new and desire to secure by Letters Patent of the United States is:

1. A thermoelectric assembly for a heating and cooling device utilizing the Peltier effect comprising a thermoelectric element, a tubular-shaped conductor link adapted to conduct an electrical current to said thermoelectric element, said thermoelectric element having a portion thereof extending into one end of said tubular-shaped conductor link, means connecting said portion of said thermoelectric element to said end of said tubular conductor link in electrical and heat transfer relationship therewith, and fin means extending outwardly from the periphery of said conductor link in heat exchange relationship with the surrounding ambient.

2. A thermoelectric assembly for a heating and cooling device utilizing the Peltier effect comprising a pair of dissimilar thermoelectric elements, a tubular-shaped conductor link adapted to conduct an electrical current between said thermoelectric elements, one of said thermoelectric elements having a portion thereof extending into one end of said tubular-shaped conductor link and the other thermoelectric element having a portion thereof extending into the opposite end of said tubular-shaped conductor link, means connecting said portions of said thermoelectric elements to said ends of said tubular conductor link in electrical and heat transfer relationship therewith, and fin means extending outwardly from the periphery of said conductor link in heat exchange relationship with the surrounding ambient.

3. A thermoelectric assembly for a heating and cooling device utilizing the Peltier effect comprising a pair of longitudinal thermoelectric elements of dissimilar thermoelectric materials, a tubular-shaped conductor link adapted to conduct an electrical current between said thermoelectric elements, said tubular-shaped conductor link having an interior opening adapted to receive the ends of said thermoelectric elements, one of said thermoelectric elements having its end thereof extending into one end of said tubular-shaped conductor link and the other thermoelectric element having its end thereof extending into the opposite end of said tubular-shaped conductor link, means for rigidly connecting said ends of said thermoelectric elements within said tubular conductor link in electrical and heat transfer relationship therewith, and fin means extending outwardly from the periphery of said conductor link in heat exchange relationship with the surrounding ambient.

4. A thermoelectric heat exchange device utilizing the Peltier effect comprising at least one pair of electrical and thermal insulation panels arranged in spaced apart relationship to provide a space therebetween through which a fluid to be heated or cooled may flow, at least one pair of dissimilar thermoelectric elements, one of said elements being mounted through one of said panels and the other of said elements being mounted through the other of said panels, said elements having portions thereof extending into said space between said panels and arranged substantially in alignment, a tubular-shaped conductor link extending between said panels for conducting an electrical current between said thermoelectric elements in said opposite panels, said tubular conductor link being disposed over said projecting portions of said thermoelectric elements, means connecting said portions of said thermoelectric elements to said ends of said tubular conductor link in electrical and heat transfer relationship therewith, and fin means extending outwardly from the periphery of said conductor link in heat exchange relationship with said fluid flowing between said panels.

5. A thermoelectric heat exchange device utilizing the Peltier effect comprising a plurality of electrical and thermal insulation panels arranged in spaced apart relationship to provide spaces between each pair of panels through which a fluid to be heated or cooled may flow, a plurality of pairs of dissimilar thermoelectric elements, one of each pair of said dissimilar thermoelectric elements being mounted through one of said panels and the other of each pair of dissimilar elements being mounted through the next adjacent panel, said dissimilar thermoelectric elements having projecting portions thereof extending into said spaces on opposite sides of said panels and arranged substantially in alignment, a plurality of tubular-shaped conductor links extending between said panels for conducting electrical current between said thermoelectric elements in said panels, said tubular-shaped conductor links being disposed over said projecting portions of said thermoelectric elements and connected to said projecting portions of said thermoelectric elements in electrical and heat transfer relationship, and fin means extending outwardly from the periphery of said conductor links in heat exchange relationship with fluid flowing between said panels.

6. A thermoelectric heating and cooling device utilizing the Peltier effect comprising at least two panels of electrical and thermal insulating material arranged in spaced apart relationship, means for circulating a fluid to be heated or cooled through said space between said panels, a plurality of dissimilar thermoelectric elements mounted in said panels with end portions thereof projecting from opposite sides of said panels into said space therebetween, all of said elements in one panel being substantially in alignment with said elements in said adjacent panel, each pair of oppositely aligned thermoelectric elements of said adjacent panels being formed of materials having dissimilar thermoelectric properties, tubular-shaped conductor links connecting said thermoelectric elements in electrical series circuit, said conductor links being mounted between said panels over said end portions of said thermoelectric elements, means rigidly connecting said tubular links in electrical and heat transfer relationship with said thermoelectric elements, fin means extending outwardly from the periphery of said tubular conductor links in heat exchange relationship with said fluid circulating through said space between said panels, and means adapted to energize said thermoelectric elements with a source of direct electrical current whereby all of said thermoelectric elements between said pair of panels either heat or cool said conductor links and their associated fins according to the polarity of said current flowing through said elements.

References Cited in the file of this patent

UNITED STATES PATENTS

| | | |
|---|---|---|
| 2,729,949 | Lindenblad | Jan. 10, 1956 |
| 2,779,172 | Lindenblad | Jan. 29, 1957 |
| 2,872,788 | Lindenblad | Feb. 10, 1959 |
| 2,941,192 | Postal | June 14, 1960 |
| 2,942,051 | Roeder | June 21, 1960 |